United States Patent [19]

Oritsuki et al.

[11] Patent Number: 4,607,168
[45] Date of Patent: Aug. 19, 1986

[54] PHOTOSENSOR ARRAY DEVICES

[75] Inventors: Ryoji Oritsuki, Mobara; Susumu Saito, Chousei; Hiromi Kanai, Chiba, all of Japan

[73] Assignee: Hitachi, Ltd., Tokyo, Japan

[21] Appl. No.: 511,333

[22] Filed: Jul. 6, 1983

[30] Foreign Application Priority Data

Jul. 9, 1982 [JP] Japan ................................ 57-118584
Jul. 9, 1982 [JP] Japan ................................ 57-118587

[51] Int. Cl.$^4$ ............................................. H01J 40/14
[52] U.S. Cl. ..................................... 250/578; 358/213
[58] Field of Search ................ 250/578, 211 J, 211 K, 250/211 R; 357/2, 4; 358/212, 213, 294

[56] References Cited

U.S. PATENT DOCUMENTS

| 4,288,702 | 9/1981 | Ozawa et al. | 250/578 |
| 4,376,888 | 3/1983 | Fukuda et al. | 250/211 J |
| 4,482,804 | 11/1984 | Oritsuki et al. | 250/211 J |
| 4,496,834 | 1/1985 | Namba et al. | 250/211 R |
| 4,499,384 | 2/1985 | Segawa et al. | 250/578 |

Primary Examiner—David C. Nelms
Assistant Examiner—J. Gatto
Attorney, Agent, or Firm—Charles E. Pfund

[57] ABSTRACT

A photosensor array device comprises a line sensor including a plurality of sets of sensors juxtaposed on a transparent glass substrate. Each set comprises an amorphous silicon photodiode, a crosstalk preventing element in the form of a diode or a transistor and a matrix wiring connected to the element. A selector is provided for driving the crosstalk preventing elements of the line sensor. The photodiode and the crosstalk preventing element are formed integrally.

4 Claims, 6 Drawing Figures

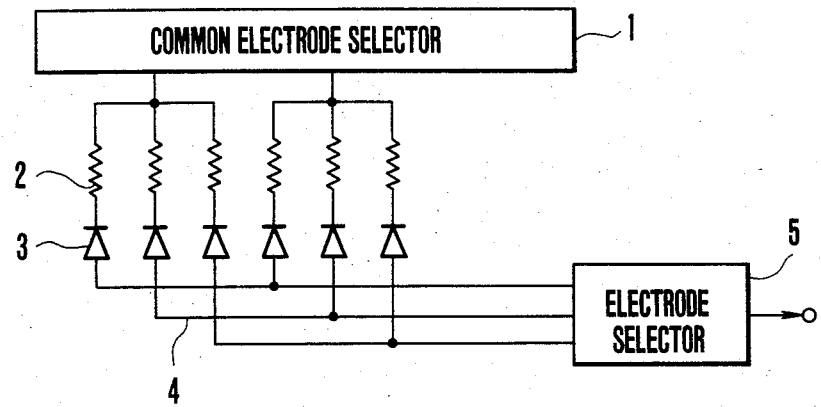
FIG. 1
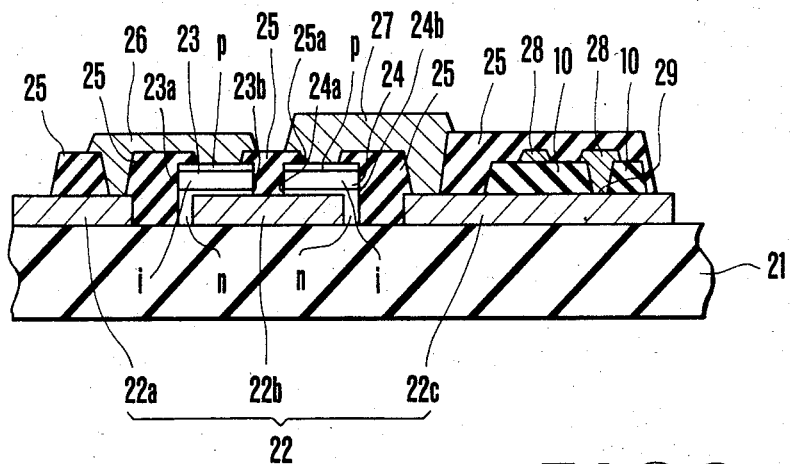
PRIOR ART  FIG. 2

PHOTOSENSOR ARRAY DEVICES

BACKGROUND OF THE INVENTION

This invention relates to a photosensor array device and more particularly to an improvement of a line sensor utilized for direct contact type photosensor array devices such as a facsimile transmitter.

Recently, with a view to reducing the size and increase the operating speed and reliability of a facsimile transmitter, a photosensor array of the direct contact type has been proposed. Such a photosensor array device includes a line sensor in which a plurality of amorphous silicon film diodes having a photoelectric conversion performance are juxtaposed on a transparent glass substrate at a pitch of about 8/mm (about 125 microns), for example and the sensor is brought into direct contact with a manuscript to be transmitted for reading the manuscript with a magnification of 1(one). For transmitting a manuscript having a width of about 220 mm, it is necessary to provide about 1760 amorphous silicon film diodes, blocking diodes of the same number connected in series with respective film diodes for preventing crosstalk caused by the divergent flow of the photoelectrically converted signals, and a matrix wiring acting as lead wires for reading out the signals.

With the type photosensor array device of this construction, since it uses amorphous silicon for fabricating the photoelectric converting elements and since it is extremely difficult to lead out a great number of signal wires for read out bits, a matrix wiring construction as shown in FIG. 1 has been proposed. More particularly, reference numeral 1 designates a common electrode selector, 2 photoelectric converting elements made of amorphous silicon film diodes, for example, 3 blocking diodes for preventing cross-talk, 4 signal wirings acting as read out signal lines, and 5 an electrode selector.

When transmitting a manuscript of about 220 mm width with the sensor array device of this construction, in order to provide a matrix wiring consisting of about 1760 signal wirings 4, it is necessary to use a multilayer wiring structure.

To explain the multilayer wiring structure, one example of the line sensor of the direct contact type photosensor array device using diodes as crosstalk preventing elements will be described with reference to FIG. 2. As shown, the line sensor comprises a transparent glass substrate 21 to which a manuscript to be transmitted, not shown, is directly contacted, and a plurality of chromium electrodes 22 formed on the substrate. In this example, about 1760 sets of electrodes 22 are juxtaposed at a pitch of 125 microns in the direction of array. Each set comprises a common electrode 22a, a connector electrode 22b and an individual electrode 22c which are aligned and spaced from each other at predetermined spacings. The line sensor further comprises a photoelectric conversion photodiode 23 made of amorphous silicon deposited on one end of the connector electrode 22b, a crosstalk preventing blocking diode 24 made of amorphous silicon deposited on the other end of the connector electrode 22b, a passivation film 25 made of SiO$_2$ or other insulator and adapted to protect opposite end portions 23a and 23b of the photodiode 23 as well as opposite end portions 24a and 24b of the blocking diode 24, a transparent film electrode 26 deposited on the passivation film 25 for electrically interconnecting the photodiode 23 and the common electrode 22a, an upper electrode 27 formed by vapor depositing aluminum on the passivation film 25 and adapted to electrically interconnect the blocking diode 24 and the individual electrode 22c, a matrix wiring insulation film 10 formed on the individual electrode 22c, a matrix wiring 28 formed by vapor depositing aluminum on the insulation film 10, and connector 29 for the matrix wiring formation.

Each photodiode 23 and blocking diode 24 has an n-type lower layer, an i-type intermediate layer and a p-type apper layer. The matrix wiring 28 and connector 29 are also covered with the passivation film 25.

With this line sensor, since the photodiode 23 which detects light reflected by the manuscript for converting the light into an electric signal, and the blocking diode 24 acting to prevent crosstalk of the matrix wiring 28 are formed separately, it has been necessary to form the upper electrode 27 by vapor depositing aluminum after protecting the end portions 23a, 23b, 24a and 24b of the diodes 23 and 24 with the passivation film 25 made of SiO$_2$ so as to prevent short circuiting between the ends, especially, opposite ends 23b and 24a. To form the upper electrode 27 on the passivation film 25, a through-hole 25a must be formed which passes through the passivation film 25. To this end, highly precise selective etching of the passivation film 25 and the blocking diode 24 is required, which decreases the yield rate of the line sensors.

SUMMARY OF THE INVENTION

Accordingly, it is an object of this invention to provide an improved photosensor array device capable of obviating various difficulties described above.

Another object of this invention is to provide an improved photosensor array device capable of eliminating the passivation film as well as the step of selective photoetching of the diode and the passivation film.

Still another object of this invention is to provide an improved photosensor array device capable of increasing the response speed of the read sensor by decreasing the output impedance.

According to this invention, there is provided a photosensor array device comprising a line sensor including a plurality of sets of sensors juxtaposed on a transparent glass substrate, each set including an amorphous silicon photodiode having a photoelectric conversion performance, a crosstalk preventing element made of amorphous silicon and connected to the diode, and a matrix wiring connected to the element, and a selector connected to the crosstalk preventing elements of the line sensor through the matrix wiring, characterized in that the amorphous silicon photodiode and the crosstalk preventing element share an amorphous silicon film formed on the substrate so as to be formed into an integral unit.

BRIEF DESCRIPTION OF THE DRAWINGS

In the accompanying drawings

FIG. 1 is a connection diagram showing an example of a photosensor array device to which the invention is applicable and which utilizes diodes as crosstalk preventing elements;

FIG. 2 is a sectional view for explaining the problems of the device utilizing diodes as crosstalk preventing elements;

DESCRIPTION OF THE PREFERRED EMBODIMENTS

Figure 3:
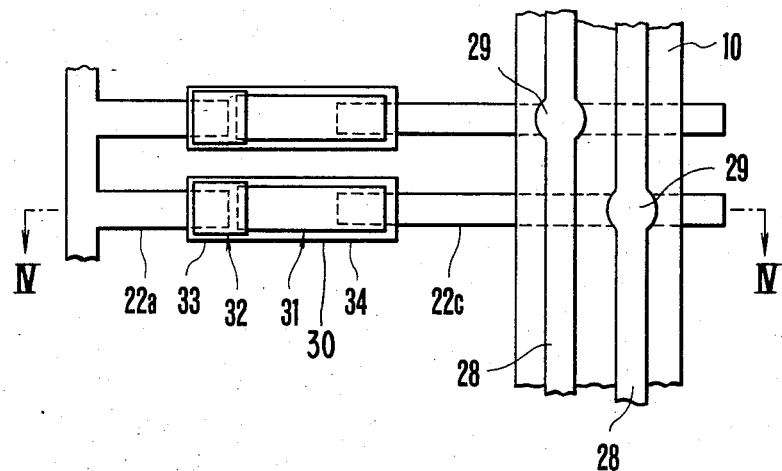
FIG. 3 is a plan view showing one embodiment of this invention in which a diode crosstalk preventing element and a photoelectric converting diode are constructed as an integral unit.
Figure 4:
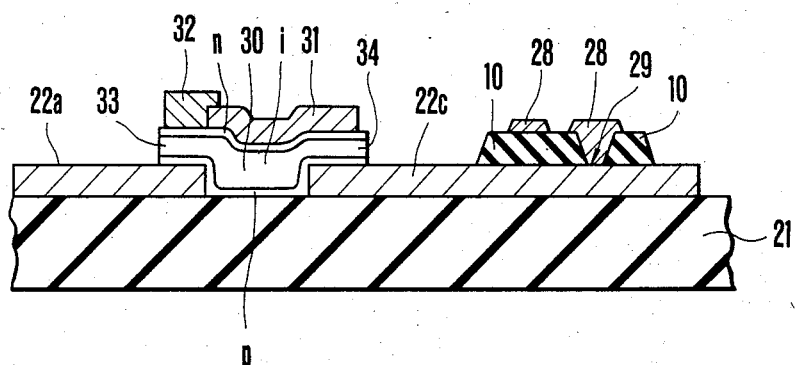
FIG. 4 is a longitudinal sectional view taken along a line IV—IV in FIG. 3.

Referring now to FIGS. 3 and 4, a preferred embodiment of the present invention will be described wherein diodes are used as crosstalk preventing elements and made integral with photoelectric converting diodes. They are connected as shown in FIG. 1. Like elements are designated by like reference numerals in FIGS. 2, 3 and 4. In a one line sensor array as shown in FIGS. 3 and 4 an island shaped p-i-n type amorphous silicon film 30 is deposited between the opposing ends of the common electrode 22a and the individual electrode 22c which are formed on the transparent glass substrate 21, and an upper electrode 31 of aluminum is vapor deposited on the central portion of the amorphous silicon film 30 except the peripheral portion thereof. A light admitting transparent electrode 32 made of a transparent electroconductive film is deposited above the opposing end of the common electrode 22a to cover one end of the upper electrode 31. Thus, a photo-diode 33 which detects light and performs photoelectric conversion is formed between the transparent electrode 32 as well as upper electrode 31 and the common electrode 22a, while a crosstalk preventing blocking diode 34 that prevents crosstalk due to the divergent flow of the photoelectrically converted signal from the matrix wiring 28 is formed between the upper electrode 31 and the individual electrode 22c. In this case, the upper electrode 31 formed on the central portion of the amorphous silicon film 30 functions to connect in series the photodiode 33 and the blocking diode 34 which are formed integrally by sharing the amorphous silicon film 30.

With the above-described line sensor, since the vapor deposited upper electrode 31 interconnecting the photodiode 33 and the blocking diode 34 does not contact the end surfaces of the amorphous silicon film 30, occurrence of the short-circuit between the photodiode 33 and the blocking diode 34 as explained previously can be prevented. When the spacing between the photodiode 33 and the blocking diode 34 is made larger than 1 mm, the current flowing through the doped layer of the amorphous silicon film 30, that is, the p-type lower layer bridging the common electrode 22a and the individual electrode 22c becomes extremely small because the leakage resistance therebetween amounts to several M$\Omega$s thus causing no trouble in practical applications. For this reason, it is not necessary to provide any passivation layer 25 (shown in FIG. 2) made of $SiO_2$ between amorphous silicon film 30 and the upper electrode 31, thus simplifying the construction.

Thus, according to this embodiment, since a photodiode having photoelectric conversion ability and a crosstalk preventing blocking diode are constructed integrally, a passivation film acting to insulate these diodes from each other and to insulate them from a wiring conductor interconnecting these diodes is not necessary. This construction also eliminates accurate selective etching process of the diodes and the passivation film. Consequently, not only the short-circuiting between the diodes can be eliminated but also the yield rate can be increased.

As mentioned previously, the matrix wiring must be materialized in the form of a multilayer structure. For example, where 1728-bit picture elements are arrayed in a matrix of 32×54 bits, there are 1728 through-hole points, and 1272×32=55264 or 1727×54=93258 crossover points. Where a $SiO_2$ film having a thickness of about 3 microns is used as the insulating layer between these multilayer wirings, the stray capacity of the multilayer wirings amounts to about $10^3$PF. When the output signals delivered out of such multilayer wirings are amplified by an amplifier havig an input impedance of about 10 K , the RC time constant becomes about 10 microseconds, thus limiting the response speed of the facsimile transmitter.

The problem can be solved by replacing the blocking diode with a blocking transistor, particularly, a thin film transistor, whereby when the gate input of the transistor is connected to the matrix wiring and the drain thereof is connected to an output signal line common to all the bits, the output impedance of the line sensor can be decreased to reduce the RC time constant, thereby making it possible to eliminate adverse effect on the response speed due to the stray capacity.

With the blocking transistor, however, a separate structure of the photoelectric conversion element and the blocking transistor raises a similar problem described in connection with the blocking diode with reference to FIG. 2.

Figure 5:
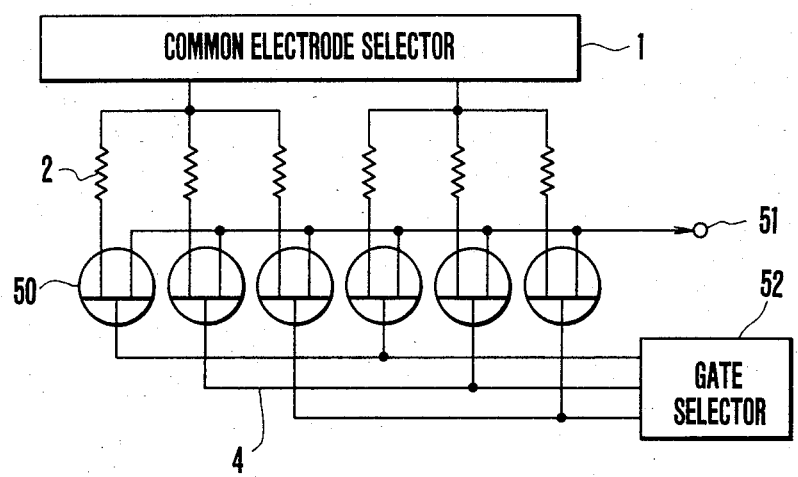
FIG. 5 is a connection diagram showing another example of a photosensor array device utilizing transistors as crosstalk preventing elements.
Figure 6:
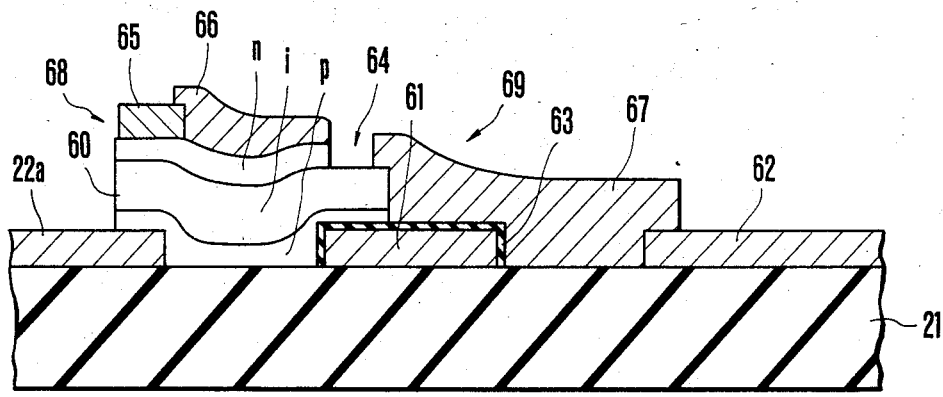
FIG. 6 is a longitudinal sectional view of another embodiment of this invention wherein transistor crosstalk preventing elements and photoelectric converting elements are constructed as an integral unit.

Thus, the present invention contemplates the provision of a photosensor array device with blocking transistors as shown in FIG. 5, and the integration of the photoelectric coversion element and the blocking transistor as shown in FIG. 6. In FIGS. 1 and 5 as well as in FIGS. 4 and 6, like elements are designated by like reference numerals.

In the photosensor array device shown in FIG. 5, a plurality of thin film transistors 50 are used for preventing crosstalk. The source electrodes of the transistors are connected to the photoelectric converting elements 2, the drain electrodes are connected to a signal output terminal 51 common to all the bits, and the gate electrodes are respectively connected to respective signal wires 4 which constitute a matrix wiring. The element 2 and the thin film transistor 50 are constituted by an amorphous silicon film to be described later. The gate electrodes of the thin film transistors 50 are sequentially selected by a gate selector 52 constituted by a pulse generator.

A multilayer wiring structure of the line sensor for the device of FIG. 5 is illustrated in FIG. 6. The common electrode 22a, a gate electrode 61 and an output electrode 62 are formed on the glass substrate 21 by vapor depositing chromium, for example. The gate electrode 61 is covered with an insulating layer 63 of $SiO_2$. An island shaped p-i-n type amorphous silicon film 60 is deposited between the opposing ends of the common electrode 22a and the gate electrode 61 covered with the $SiO_2$ insulating layer 63. An n-type upper layer of the film 60 is partly etched by light etching of $CF_4$ plasma to provide a channel 64 of a transistor 69. The n-type upper layer is partly deposited with a light admitting transparent electrode 65 and partly deposited with an aluminum electrode 66 which is contiguous to the transparent electrode 65. An aluminum electrode 67 is deposited between the opposing ends of the gate electrode 61 covered with the insulating layer 63 and the output electrode 62. The electrode 67 overlies the edge of an i-type intermediate layer of the film 60 and is contiguous to the intermediate layer. The electrode 66 serves as a source of the transistor 69 and the electrode 67 as a drain.

Thus, the amorphous silicon film 60 is shared by a photodiode 68 acting as a photoelectric converting element and the thin film transistor 69 acting as a crosstalk prevention blocking element, thus completing the formation of the photoelectric converting and crosstalk prevention blocking elements as an integral unit. Obviously, the gate electrode 61 is connected with the matrix wiring (not shown).

With the device of FIG. 5, when a manuscript, not shown, is directly mounted on the photosensor array device, the photosignals received by respective photoelectric converting elements 2 are converted into electric signals. By selecting film transistors 50 connected to respective photoelectric converting elements 2 with a gate electrode selection signal outputted from the gate selector 52 the electric signals can be read out through the output terminal 51 common to all the bits. The output impedance of the line sensor is determined by the product of the stray capacitance of the multilayer signal wirings 4 and the impedance of the gate selector 52 driving the gate electrodes of the film transistors 50. As it is possible to decrease the output impedance to about 50 ohms, the RC time constant can be reduced by a factor of two orders of magnitude.

Consequently, it is possible to greatly increase the response speed of the read out sensor. In addition, thanks to the integration of the photodiode and blocking transistor, the fabrication of the device can be simplified and the yield rate can be improved.

What is claimed is:

1. A photosensor array device comprising:
an insulating substrate;
a plurality of photo-diodes formed on said substrates; and
a plurality of insulated-gate thin film field-effect transistors formed on said insulating substrate, and each coupled to a respective one of said photo-diodes so that the conduction path between the source and drain path of each of said transistors is coupled in series with its respective photo-diodes;
said photo-diode and said transistors including a plurality of amorphous silicon islands each island being common to a coupled photo-diode transistor pair.

2. A photosensor array device comprising:
an insulating substrate;
a plurality of photo-diodes formed on said substrate; and
a plurality of thin film transistors one for each of said photo-diodes formed on said insulating substrate with connections respectively for selecting said photo-diodes;
each of said photo-diode being comprised of an amorphous silicon film;
each of said transistors comprising a source electrode, a drain electrode, an amorphous silicon film and a gate electrode for controlling electrical conductance of said film between said source and drain electrodes, said amorphous silicon film being integral for each photo-diode-transistor pair.

3. The photosensor array according to claim 2, wherein said amorphous silicon film of each of said photo-diodes and each of said transistors are simultaneously formed in the same manufacturing step.

4. The photosensor array according to claim 1 or claim 2 wherein an electrode of each of said photo-diodes and an electrode of each of said transistors are simultaneously formed in the same manufacturing step.

* * * * *